(12) United States Patent
Shin et al.

(10) Patent No.: US 9,301,411 B2
(45) Date of Patent: Mar. 29, 2016

(54) DISPLAY DEVICE USING SANDWICH HONEYCOMB PANEL

(71) Applicant: LG Electronics Inc., Seoul (KR)

(72) Inventors: Donghyok Shin, Pyeongtaek-si (KR);
Sangdon Park, Pyeongtaek-si (KR);
Seunghyun Yun, Pyeongtaek-si (KR)

(73) Assignee: LG ELECTRONICS INC., Seoul (KR)

( * ) Notice: Subject to any disclaimer, the term of this patent is extended or adjusted under 35 U.S.C. 154(b) by 251 days.

(21) Appl. No.: 13/940,957

(22) Filed: Jul. 12, 2013

(65) Prior Publication Data

US 2014/0016302 A1    Jan. 16, 2014

(30) Foreign Application Priority Data

Jul. 13, 2012    (KR) .................. 10-2012-0076439
May 31, 2013    (KR) .................. 10-2013-0062895

(51) Int. Cl.
*H05K 5/00*    (2006.01)
*H05K 5/02*    (2006.01)
*G09F 9/30*    (2006.01)

(52) U.S. Cl.
CPC ............... *H05K 5/0217* (2013.01); *G09F 9/30* (2013.01); *H05K 5/0017* (2013.01)

(58) Field of Classification Search
None
See application file for complete search history.

(56) References Cited

U.S. PATENT DOCUMENTS

| 4,197,341 A | 4/1980 | Rule |
| 2008/0259547 A1 | 10/2008 | Kim |
| 2012/0020056 A1 | 1/2012 | Yamagata et al. |
| 2012/0262660 A1* | 10/2012 | Fujiwara et al. ............. 349/158 |

FOREIGN PATENT DOCUMENTS

| CN | 101290731 A | 10/2008 |
| JP | 200758243 A | 3/2007 |
| WO | 2011/125307 A1 | 10/2011 |

* cited by examiner

*Primary Examiner* — Britt D Hanley
(74) *Attorney, Agent, or Firm* — Dentons US LLP

(57) ABSTRACT

A display device includes a display module, a sandwich honeycomb panel coupled to a rear of the display module, the sandwich honeycomb panel including a front thin plate located at the display module side, a rear thin plate opposing the front thin plate, and a honeycomb structure disposed between the front thin plate and the rear thin plate, the honeycomb structure including a plurality of hexagonal unit cells. A fastener including a fastener body, the fastener being inserted into the sandwich honeycomb panel such that a surface of the fastener is exposed from a rear of the sandwich honeycomb panel.

20 Claims, 15 Drawing Sheets

DISPLAY DEVICE USING SANDWICH HONEYCOMB PANEL

Pursuant to 35 U.S.C. §119(a), this application claims the benefit of earlier filing date and right of priority to Korean Application No. 10-2012-0076439, filed on Jul. 13, 2012, and No. 10-2013-0062895, filed on May 31, 2013 and, the contents of which are hereby incorporated by reference herein in their entirety.

BACKGROUND

1. Field of the Disclosure

The present disclosure relates to a display device using a sandwich honeycomb panel.

2. Background

A display device using a conventional liquid crystal display panel or a conventional plasma display panel includes a glass panel constituting a basic screen, a middle frame, and a rear cover. Various circuits to drive the display device are arranged in the middle frame. In addition, the middle frame connects the glass panel to the rear cover. The rear cover secures overall rigidity of the display device, efficiently dissipates heat emitted from the glass panel and the circuits from the display device, and forms the external appearance of the display device.

In recent years, efforts to reduce the thickness of display devices have been continuously made and fundamental attempts to simplify the structure of the conventional display device have also been made. Particularly as the thickness of a display device decreases, development of materials for the rear cover and improvement in the structure of the rear cover have been continuously conducted to secure desired structural integrity and heat dissipation characteristics of the rear cover.

In the conventional display device, the rear cover is generally formed of a typical metal material, such as aluminum. As the thickness of the rear cover is extremely reduced, structural characteristics of the rear cover are limited.

Particularly as a percentage of the rear cover contributing to overall rigidity of the display device is increased, a material for the rear cover requires excellent mechanical characteristics. However, the conventional rear cover, which is formed of aluminum, does not satisfy required mechanical characteristics. Particularly as the size of the rear cover is greatly increased, such a problem may be more serious. For this reason, it is necessary to develop materials for the rear cover that are capable of newly designing the structure of the rear cover.

SUMMARY

Accordingly, the present disclosure is directed to a display device using sandwich honeycomb panel that substantially obviates one or more problems due to limitations and disadvantages described above.

One object is to provide a display device wherein a fastener, such as a PEM nut is easily inserted into a sandwich honeycomb panel such that the PEM nut is stably fixed in the sandwich honeycomb panel and the rigidity of the display device is improved while a curved state of the display device is maintained.

Additional advantages, objects, and features will be set forth in part in the description which follows and in part will become apparent to those having ordinary skill in the art upon examination of the following or may be learned from practice of the invention. The objectives and other advantages may be realized and attained by the structure particularly pointed out in the written description and claims hereof as well as the appended drawings.

To achieve these objects and other advantages, as embodied and broadly described herein, a display device includes a display module, a sandwich honeycomb panel coupled to a rear of the display module, the sandwich honeycomb panel including a front thin plate located at the display module side, a rear thin plate opposing the front thin plate, and a honeycomb structure disposed between the front thin plate and the rear thin plate, the honeycomb structure including a plurality of hexagonal unit cells, and a fastener including a fastener body, the fastener being inserted into the sandwich honeycomb panel such that a surface of the fastener is exposed from a rear of the sandwich honeycomb panel.

The fastener may be a PEM nut including a PEM nut body having a screw insertion part formed at one end thereof, the PEM nut being inserted into the sandwich honeycomb panel such that the screw insertion part is exposed from the rear of the sandwich honeycomb panel. The PEM nut may have an outer circumference corresponding to a shape of each of the unit cells.

The PEM nut body may be fastened to the front thin plate by a screw.

The PEM nut may further include a PEM nut head formed at the other end thereof, the PEM nut head having a greater size than a diameter of the PEM nut body, and a portion of the front thin plate into which the PEM nut is inserted may be provided with an opening corresponding to a shape of the PEM nut head such that the PEM nut head is inserted into the opening.

The PEM nut head may be formed in a hexagonal shape.

The PEM nut head may have the same thickness as the front thin plate.

The PEM nut head may be coupled to the PEM nut body by a screw.

The fastener body may protrude from the rear thin plate and the display device may further include a washer fitted on the protruding portion of the fastener body and fixed to the rear thin plate.

A bonding agent may be applied between the fastener and the sandwich honeycomb panel.

The display device may further include a through hole formed in the sandwich honeycomb panel such that the fastener is inserted into the through hole and a resin filled between the fastener body and the through hole.

The front thin plate or the rear thin plate may include an end protruding outward from the honeycomb structure and the end may be bent to cover a circumference of the honeycomb structure.

The front thin plate or the rear thin plate may include an end portion protruding outward from the honeycomb structure and a side termination member may be attached to the end portion and a lateral circumference of the honeycomb structure.

The sandwich honeycomb panel may contain aluminum.

The front thin plate and the rear thin plate may have a thickness of 0.6 mm or less.

The display module may include an organic light emitting diode (OLED).

In another aspect, a display device includes a curved display module, a middle portion of which protrudes in a rear direction with respect to opposite sides, and the opposite sides which protrude in a front direction with respect to the middle portion, and a sandwich honeycomb panel coupled to a rear of the display module, the sandwich honeycomb panel being curved, wherein the sandwich honeycomb panel includes a front thin plate located at the display module side, a rear thin plate opposing the front thin plate, and a honeycomb structure disposed between the front thin plate and the rear thin plate, the honeycomb structure including a plurality of hexagonal unit cells.

Each of the hexagonal unit cells may be configured such that facing sides of each of the hexagonal unit cells are parallel to each other.

The honeycomb structure may be formed by stacking a plurality of metal sheets having concave and convex parts formed in a trapezoidal fashion such that the metal sheets are not aligned with each other.

Each of the hexagonal unit cells may be configured such that a size of a hexagon contacting the rear thin plate is greater than that of a hexagon contacting the front thin plate.

The honeycomb structure may be configured such that sizes of hexagonal unit cells located at a middle portion of the display module are less than those of hexagonal unit cells located at left and right portions of the display module.

The honeycomb structure may include first hexagonal unit cells disposed at a middle portion of the display module and second hexagonal unit cells disposed at left and right portions of the display module and the first hexagonal unit cells may have greater rigidity than the second hexagonal unit cells.

A side termination member may be attached to a circumference of the sandwich honeycomb panel.

The display device may further include a PEM nut include a PEM nut body having a screw insertion part formed at one end thereof, the PEM nut being inserted into the sandwich honeycomb panel such that the screw insertion part is directed in a rear direction, wherein the rear thin plate may further include an opening, through which the screw insertion part is exposed.

In a display device according to at least one embodiment of the present invention, a PEM nut suitable for a specific structure of a sandwich honeycomb panel is used to stably fix the PEM nut to the sandwich honeycomb panel.

In addition, a coupling structure between the PEM nut and the sandwich honeycomb panel is simple. Consequently, it is possible to simplify a process of coupling the PEM nuts to the sandwich honeycomb panel.

In addition, the sandwich honeycomb panel located at the rear of a display panel offsets restoring force of a curved display module to a flat shape. Consequently, it is possible to support the curved display module while maintaining a curved state of the curved display module.

In addition, the rigidity of the sandwich honeycomb panel is great as compared with the weight and thickness of the sandwich honeycomb panel. Consequently, it is possible to reduce the size and weight of the display device.

The technical problems to be solved are not limited to the above technical problems and those skilled in the art may understand other technical problems from the following description.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the invention. The above and other aspects, features, and advantages will become more apparent upon consideration of the following description of preferred embodiments, taken in conjunction with the accompanying drawing figures. In the drawings.

DETAILED DESCRIPTION OF THE PREFERRED EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Figure 1:
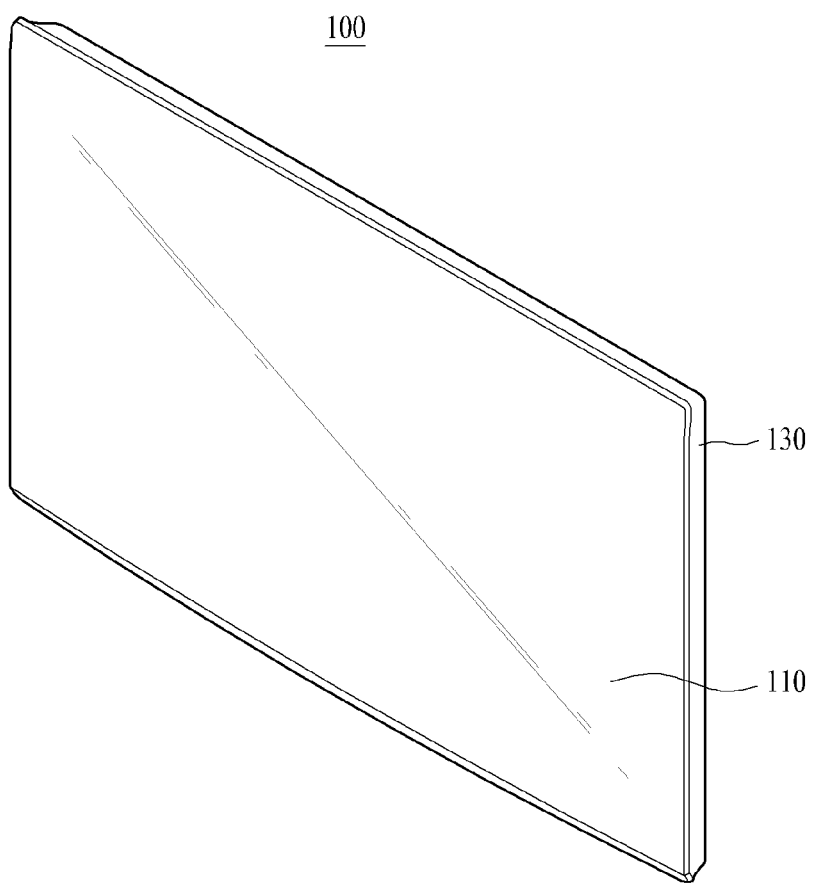
FIG. 1 is a front view showing a display device according to a first embodiment of the present invention.
Figure 2:
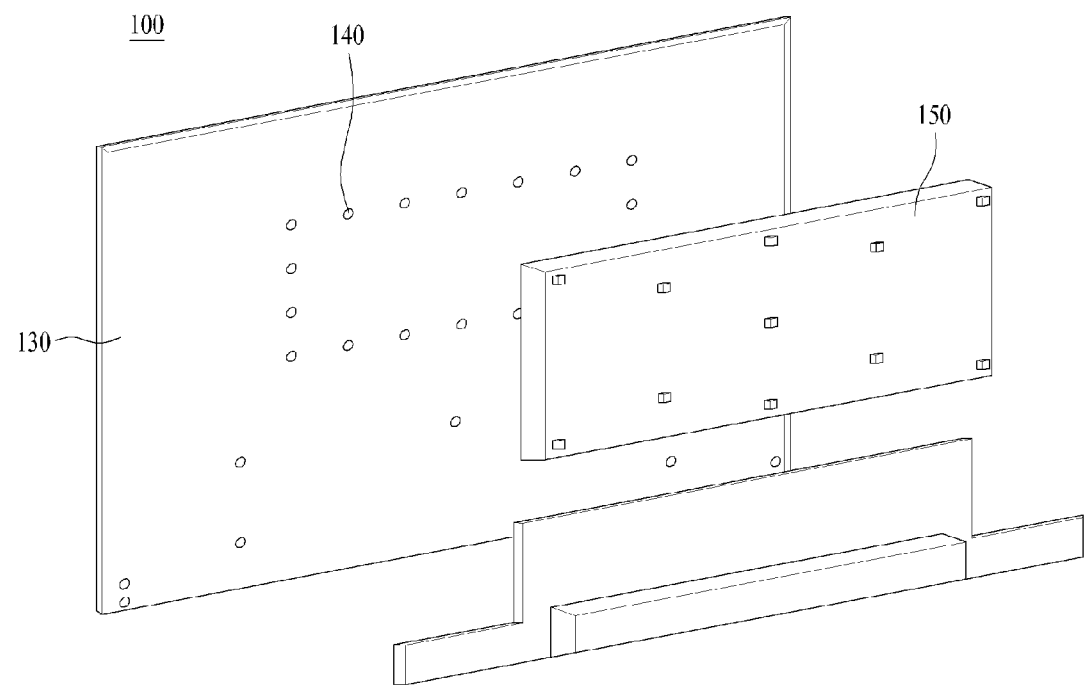
FIG. 2 is an exploded perspective view showing the rear of the display device according to the first embodiment of the present invention.

FIG. 1 is a front view showing a display device 100 according to a first embodiment of the present invention and FIG. 2 is an exploded perspective view showing the rear of the display device 100 according to the first embodiment of the present invention. The display device 100 mainly includes a display module 110 and a case.

The display module 110 outputs video on a screen. A predetermined portion of the display module 110 may be deformed. The display module 110 is a device that divides video into a plurality of pixels, digitizes information, such as hue, brightness, and saturation, per pixel into electric signals, and emits light based on hue, brightness, and saturation of each pixel according to the electric signals, thereby outputting video.

A liquid crystal display, a thin film transistor liquid crystal display, a plasma display, an organic light emitting diode (OLED) display, and etc., may be used as a flat panel display device having such a video output function.

The case is coupled to the rear of the display module 110 to protect the display module 110. In the case is mounted a controller to supply power to the display device 100 or to control the display device 100.

Due a device, such as an organic light emitting diode, that has been used in recent years, the thickness of the display module 110 has been decreased. As consumers prefer a thin display device 100, the case is configured to include a rear panel to cover only the rear of the display module 110. In this case, a control box, in which various electronic components and the controller are mounted, is coupled to the rear panel.

The structure using the rear panel has an advantage in that the thickness of the display device 100 is reduced. Since the rigidity of the display device 100 is decided by the thickness of the rear panel, however, it is not possible to unconditionally reduce the thickness of the rear panel. In a case in which the thickness of the rear panel is increased, the weight of the display device 100 is increased. As a result, the amount of materials used to manufacture the case is increased, whereby case manufacturing costs are increased.

Figure 3:
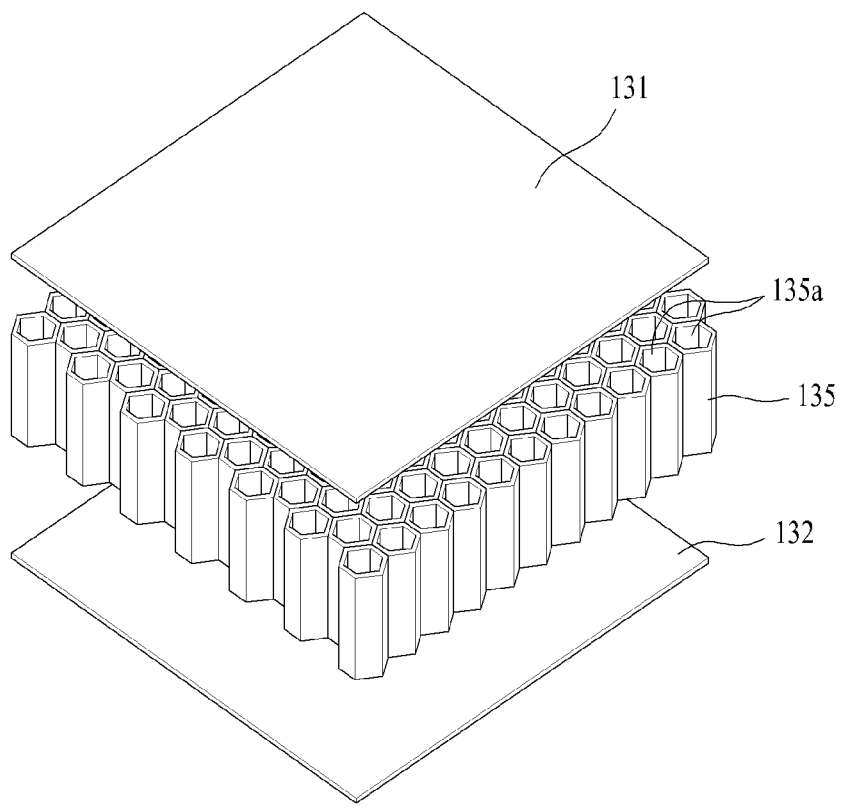
FIG. 3 is an exploded perspective view showing a honeycomb structure of a sandwich honeycomb panel of the display device according to the first embodiment of the present invention.

A sandwich honeycomb panel 130 to secure the rigidity of the display device 100 and reduce the weight of the display device 100 may be used as the rear panel of the display device 100. As shown in FIG. 3, the sandwich honeycomb panel 130 is configured to have a three-layer structure including a pair of thin plates 131 and 132 and a honeycomb structure 135 disposed between the thin plates 131 and 132.

The honeycomb structure 135 includes a plurality of hollow hexagonal pillar shaped unit cells 135*a*. Since sides of each hexagonal pillar are perpendicular to each plane of the honeycomb panel 130 (the plane of each thin plate), rigidity of the honeycomb structure 135 is great with respect to force in all directions. Consequently, the honeycomb panel has an advantage in that the honeycomb panel has greater rigidity than a conventional rear panel including a single member.

In the display device 100 according to the first embodiment of the present invention, a pair of thin plates 131 and 132 having a thickness of 0.2 mm and a honeycomb structure 135 having a thickness of 2.6 mm are used to constitute a sandwich honeycomb panel 130 having a thickness of about 3 mm. When the sandwich honeycomb panel 130 having the above-defined thickness is used, it is possible to provide a case that is capable of protecting the display module 110 from external impact and is difficult to easily deform.

In the display device 100 including a control box 150 as shown in FIG. 2, it is necessary to insert a plurality of fasteners, such as PEM nuts 140 to fix the control box 150 into the case. A PEM nut 140 is a structure having a screw insertion part 142 corresponding to the shape of a screw 144 such that the screw 144 can be inserted into the screw insertion part 142. When two members are coupled to each other using a screw 144, a PEM nut 140 is inserted into one of the members. For ease of explanation, the PEM nut will be used in describing the features of the embodiments. Of course, the PEM nut may be substituted with any suitable fasteners.

In order for the member, in which the PEM nut 140 is inserted, to support the PEM nut 140, it is necessary for the member to have a thickness of about 0.8 mm or more. However, as described above, the thickness of each of the thin plates 131 and 132 of the honeycomb panel 130 is merely 0.2 mm. For this reason, it is difficult to fix the PEM nut 140 in the thin plates 131 and 132 of the honeycomb panel 130.

Figure 4:
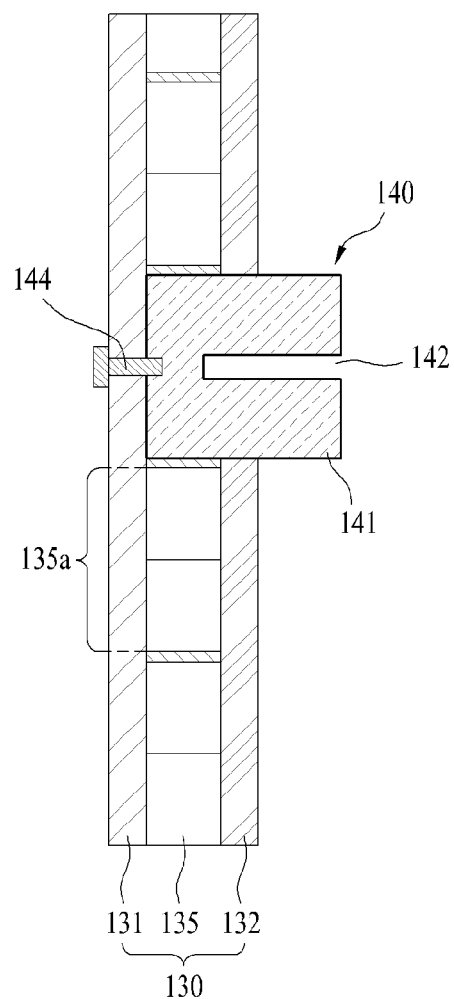
FIG. 4 is a sectional view showing the display device according to the first embodiment of the present invention.

The PEM nut 140 according to embodiments of the present invention is configured to have a structure in which the PEM nut 140 can be easily inserted into the honeycomb panel 130 and be stably fixed in the honeycomb panel 130 after insertion. FIG. 4 is a sectional view showing the display device according to the first embodiment of the present invention. Referring to FIG. 4, the sandwich honeycomb panel 130 is coupled to the rear of the display module 110.

The PEM nut 140 according to a first embodiment of the present invention includes a PEM nut body 141 having a screw insertion part 142 formed at one side thereof. The PEM nut 140 is inserted into the sandwich honeycomb panel 130 such that the screw insertion part 142 is exposed at the rear of the sandwich honeycomb panel 130.

As shown in FIG. 4, the PEM nut body 141 of the display device 100 is inserted into a corresponding one of the unit cells 135*a* of the sandwich honeycomb panel 130. That is, the shape of the outer circumference of the PEM nut body 141 corresponds to the shape of a corresponding one of the unit cells 135*a* of the sandwich honeycomb panel 130 such that the PEM nut body 141 can be inserted into corresponding one of the unit cells 135*a* of the sandwich honeycomb panel 130.

Figure 5:
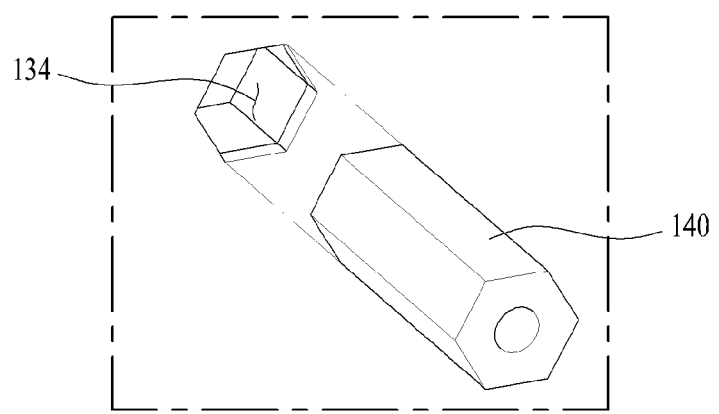
FIG. 5 is an exploded perspective view showing an embodiment of a PEM nut of the display device according to the first embodiment of the present invention.

As previously described, each unit cell 135*a* is formed in the shape of a hollow hexagonal pillar. For this reason, the PEM nut body 141 is formed in the shape of a hexagonal pillar which can be inserted into a corresponding one of the unit cells 135*a* as shown in FIG. 5.

The honeycomb structure 135 has great strength in a direction perpendicular to the thickness thereof. When the PEM nut 140 inserted into a corresponding one of the unit cells 135*a* is coupled to a screw 144 to fix the control box 150, the honeycomb structure 135 can support the weight of the control box 150.

In order to more stably fix the control box 150, a bonding agent may be applied to the outer circumference of the PEM nut body 141. Alternatively, as shown in FIG. 4, the front thin plate 131 contacting the display module 110 and the other end of the PEM nut body 141 may be fastened using a screw 144 such that the PEM nut body 141 is fixed.

That is, an opening 134 is formed at a portion of the rear thin plate 132 of the sandwich honeycomb panel 130 at which the PEM nut 140 is to be inserted such that one unit cell 135*a* is exposed through the opening 134. Alternatively, an opening 134, in which the PEM nut 140 is to be inserted, may be pre-formed at a portion of the rear thin plate 132 at which the PEM nut 140 is to be inserted, and then the rear thin plate 132 may be coupled to the honeycomb structure 135 to manufacture the sandwich honeycomb panel 130.

A bonding agent may be applied to the PEM nut body 141 and then, the PEM nut body 141 may be inserted into the honeycomb unit cell 135*a* exposed at the rear of the sandwich honeycomb panel 130. Alternatively, the PEM nut body 141 may be fixed using a screw 144 which is inserted into the other end of the PEM nut body 141 through the front thin plate 131.

Subsequently, as shown in FIG. 4, the sandwich honeycomb panel 130 is coupled to the display module 110 using a double-sided adhesive tape.

Figure 6:
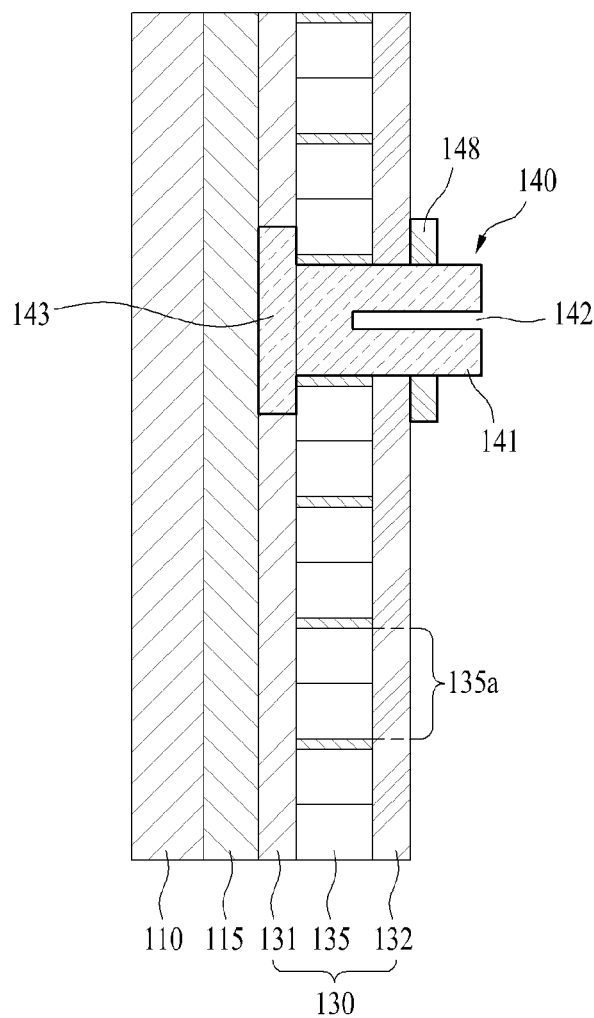
FIG. 6 is a sectional view showing a display device according to a second embodiment of the present invention.

FIG. 6 is a sectional view showing a display device according to a second embodiment of the present invention. A PEM nut 140 used in the second embodiment of FIG. 6 includes a PEM nut head 143. The PEM nut head 143 is plate type member coupled to the other side of a hole into which a screw 144 is inserted, i.e. the other end of a PEM nut body 141. The PEM nut head 143 has an area greater than the diameter of the PEM nut body 141. As shown in FIG. 6, the PEM nut head 143 is located at the outside of a honeycomb structure 135 and on the same plane as a front thin plate 131 to fix the PEM nut body 141 to the sandwich honeycomb panel 130.

The PEM nut body 141, which is formed in the shape of a hexagonal pillar, may be inserted into a corresponding unit cell 135a such that the PEM nut 140 can be stably fixed. In addition, the PEM nut head 143 may be formed in a polygonal shape instead of a circular shape to more stably fix the PEM nut 140. Particularly in a case in which the PEM nut head 143 is formed in a hexagonal shape as shown in FIG. 7, force applied to the PEM nut may be uniformly distributed.

In order to prevent the sandwich honeycomb panel 130 from coming off the display module 110 when the sandwich honeycomb panel 130 is coupled to the display module 110, the thickness of the head of the PEM nut 140 may correspond to that of the front thin plate 131 as shown in FIG. 6. For example, the head of the PEM nut 140 may be flush with the front thin plate 131.

Figure 7:
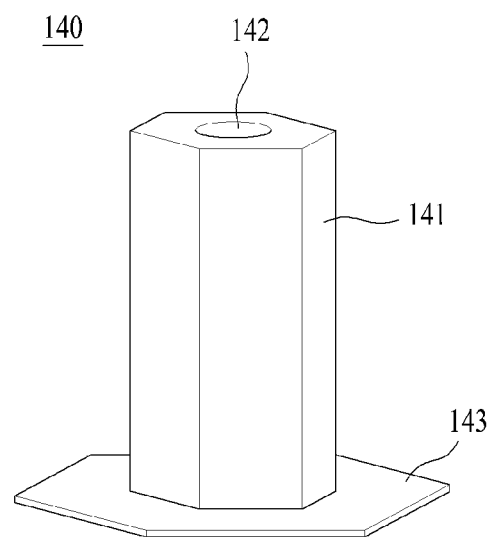
FIG. 7 is an exploded perspective view showing an embodiment of a PEM nut of FIG. 6.
Figure 8:
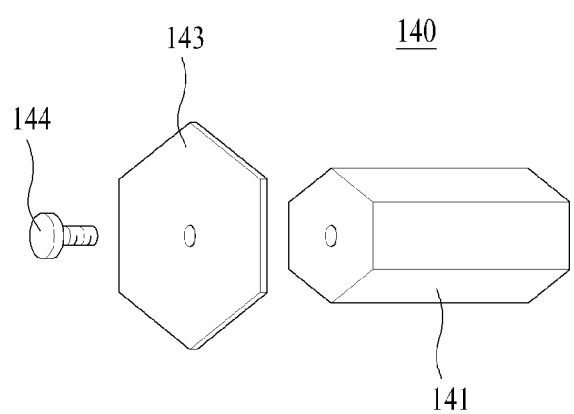
FIG. 8 is an exploded perspective view showing another embodiment of the PEM nut of FIG. 6.

In a case in which it is difficult to integrate the PEM nut head 143 with the PEM nut body 141 as shown in FIG. 7 since the thickness of the PEM nut head 143 is small, the PEM nut head 143 and the PEM nut body 141 may be separately manufactured and then be coupled to each other using a screw 144 as shown in FIG. 8.

Figure 9:
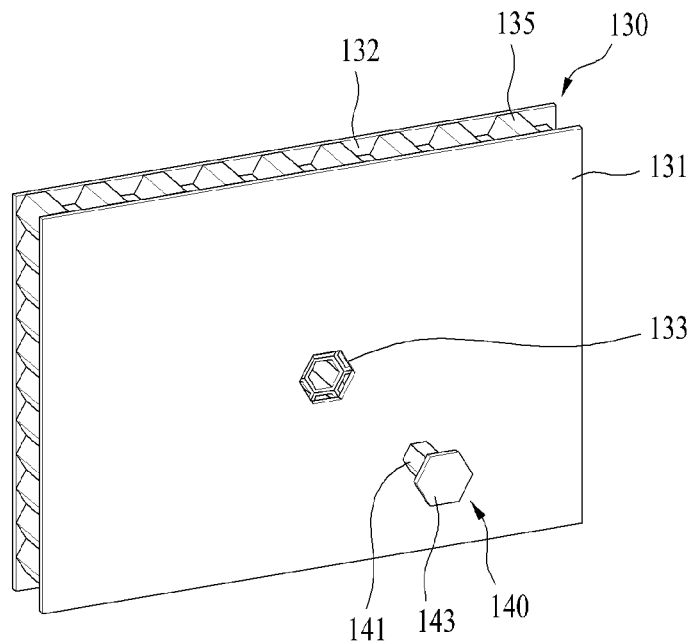
FIGS. 9 and 10 are perspective views showing a sandwich honeycomb panel and a PEM nut of the display device according to the second embodiment of the present invention.
Figure 10:
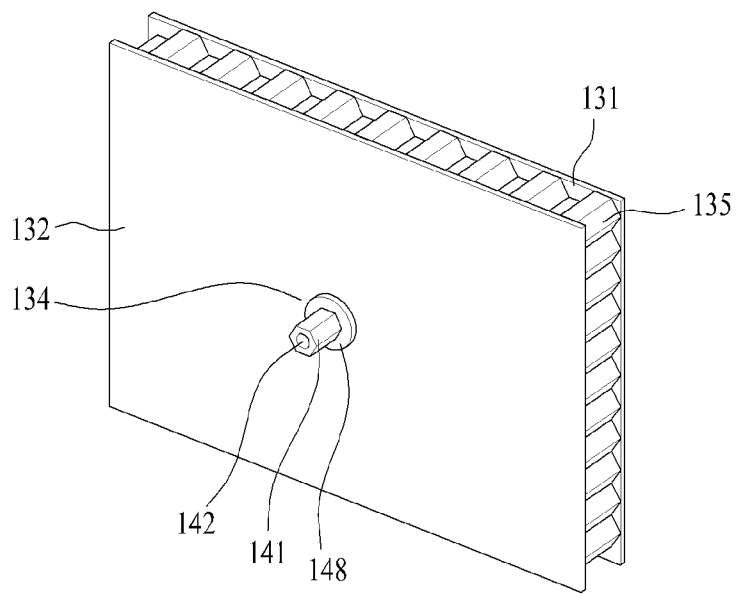

In order to insert the PEM nut 140 having the PEM nut head 143 into the sandwich honeycomb panel 130, it is necessary to form openings 133 and 134 at the front thin plate 131 and the rear thin plate 132 as shown in FIGS. 9 and 10. The opening 133, which has a size corresponding to the PEM nut head 143, is formed at the front thin plate 131. On the other hand, the opening 134, which has a size corresponding to the section of the PEM nut body 141, is formed at the rear thin plate 132.

After insertion of the PEM nut 140, the PEM nut head 143 is located on the same plane as the front thin plate 131 with the result that the front of the sandwich honeycomb panel 130 is uniform and one end of the PEM nut body 141 protrudes with the result that the screw insertion part 142 is exposed outward from the rear of the sandwich honeycomb panel 130.

The PEM nut body 141 may have the same thickness as the sandwich honeycomb panel 130. Alternatively, as shown in FIG. 10, the PEM nut body 141 may protrude from the rear of the sandwich honeycomb panel 130. Whether the PEM nut body 141 protrudes from the rear of the sandwich honeycomb panel 130 may be decided by the thickness of the screw insertion part 142 or the thickness of the sandwich honeycomb panel 130.

In a case in which the PEM nut body 141 protrudes from the rear thin plate 132 as shown in FIG. 10, a washer 148 may be coupled to the PEM nut body 141 to stably fix the PEM nut 140 to the sandwich honeycomb panel 130. The washer 148 may be a plate type member having a hole corresponding to the section of the PEM nut body 141. The PEM nut body 141 may be inserted through the hole of the washer and the washer 148 may be coupled to the rear thin plate 132 using a double-sided adhesive tape. The washer 148 more stably fixes the PEM nut 140 to the sandwich honeycomb panel 130 to prevent the PEM nut 140 inserted in the sandwich honeycomb panel 130 from moving.

Figure 11:
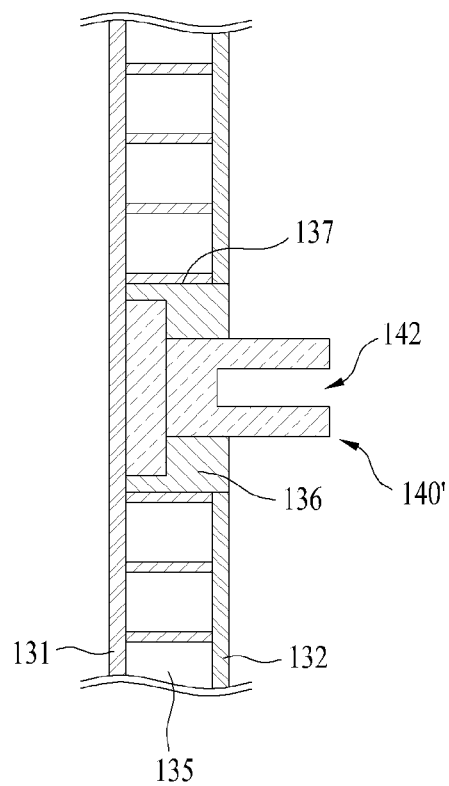
FIG. 11 is a sectional view showing the display device according to a third embodiment of the present invention.

FIG. 11 is a sectional view showing the display device 110 according to a third embodiment of the present invention. A circular PEM nut 140, which is generally used, may be used as the PEM nut 140 according to the third embodiment of the present invention. A hole having a size greater than the thickness of a PEM nut body 141 is formed in a sandwich honeycomb panel 130. And the hole is filled with a resin 136 to fix the PEM nut 140.

A honeycomb structure 135 and a rear thin plate 132 of the sandwich honeycomb panel 130 may be cut to form a PEM nut insertion part 137, and the PEM nut 140 may be inserted into the PEM nut insertion part 137 such that a screw insertion part 142 of the PEM nut 140 is exposed, and the PEM nut insertion part 137 may be filled with the resin 136. Alternatively, the sandwich honeycomb panel 130 may be cut to form a PEM nut insertion part 137, the PEM nut insertion part 137 may be filled with the resin 136, the resin 136 may be hardened, a hole corresponding to the section of the PEM nut 140 may be formed in the hardened resin, and the PEM nut 140 may be inserted into the hole.

This structure has an advantage in that fixing force is increased by the resin 136 and a conventional PEM nut 140 may be used with the result that it is not necessary to manufacture an additional PEM nut 140.

The honeycomb structure 135 is exposed from the circumference of the sandwich honeycomb panel 130. Since the honeycomb structure 135 is exposed outward, the external appearance of the sandwich honeycomb panel 130 may be unsightly. For this reason, it is necessary to cover the circumference of the sandwich honeycomb panel 130. Since the thickness of the sandwich honeycomb panel 130 is small, however, it may be difficult to couple a termination member to the sandwich honeycomb panel 130 in order to cover the circumference of the sandwich honeycomb panel 130.

Figure 12:
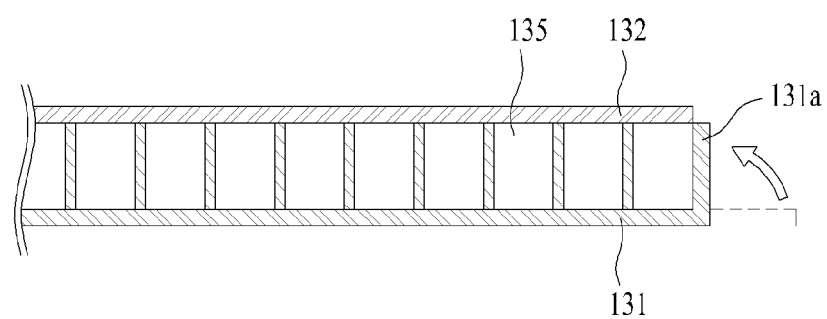
FIGS. 12 and 13 are sectional views showing a termination structure of a rear panel of the display device according to the third embodiment of the present invention.

To this end, as shown in FIG. 12, one of the thin plates 131 and 132 disposed at opposite sides of the sandwich honeycomb panel 130 may be formed so as to be larger than the honeycomb structure 135 such that one of the thin plates 131 and 132 protrudes outward from the honeycomb structure 135 and a protruding thin plate portion 131a may be bent to cover the honeycomb structure 135 exposed at the circumference of the sandwich honeycomb panel 130.

Figure 13:
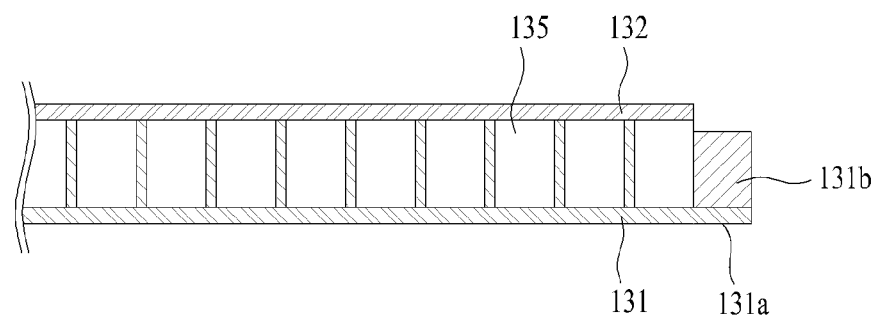

Alternatively, as shown in FIG. 13, a termination member 131b may be coupled to both the circumference of the honeycomb structure 135 and a protruding portion 131a of a thin plate formed so as to be larger than the honeycomb structure 135. In this case, it is possible to easily attach the termination member 131b to the circumference of the honeycomb structure and the protruding portion 131a as compared with in a case in which the termination member 138b is coupled only to the circumference of the honeycomb structure 135.

Figure 14:
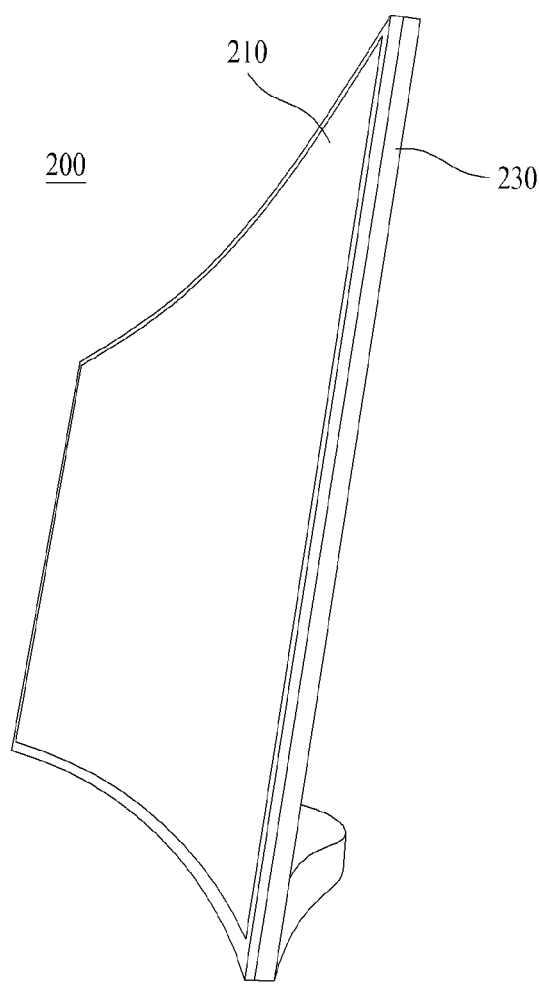
FIG. 14 is a perspective view showing a display device according to a fourth embodiment of the present invention.

FIG. 14 is a perspective view showing a display device 200 according to a fourth embodiment of the present invention. In this embodiment, the display device 200 includes a front display module 210 and a rear panel 230 to support the display module 210.

The display module 210 is a device that divides video into a plurality of pixels, digitizes information, such as hue, brightness, and saturation, per pixel into electric signals, and emits light based on hue, brightness, and saturation of each pixel according to the electric signals, thereby outputting video.

As the size of a screen of the display device 200 is greatly increased, the distance between the display device 200 and a user is increased at opposite ends of the display device 200. Particularly in a case in which three-dimensional (3D) stereoscopic video is realized, a stereoscopic effect of the video is decreased at the opposite ends of the display device 200. In this embodiment, the display device 200 may be curved as shown in FIG. 14 in order to solve the above problem.

Particularly as an organic light emitting diode display device 200 has been developed in recent years, a backlight unit or a liquid crystal panel may be omitted with the result that it is possible to easily realize a curved display panel 210. For instance, the organic light emitting diode display is manufactured in a flat form, which can be curved when force is applied. The organic light emitting diode display may have restoring force to change from the curved shape back to the flat shape. Particularly, the greatest restoring force may be applied to the middle portion of the organic light emitting diode display. For this reason, it may be necessary to provide a structure to offset such restoring force.

Figure 15:
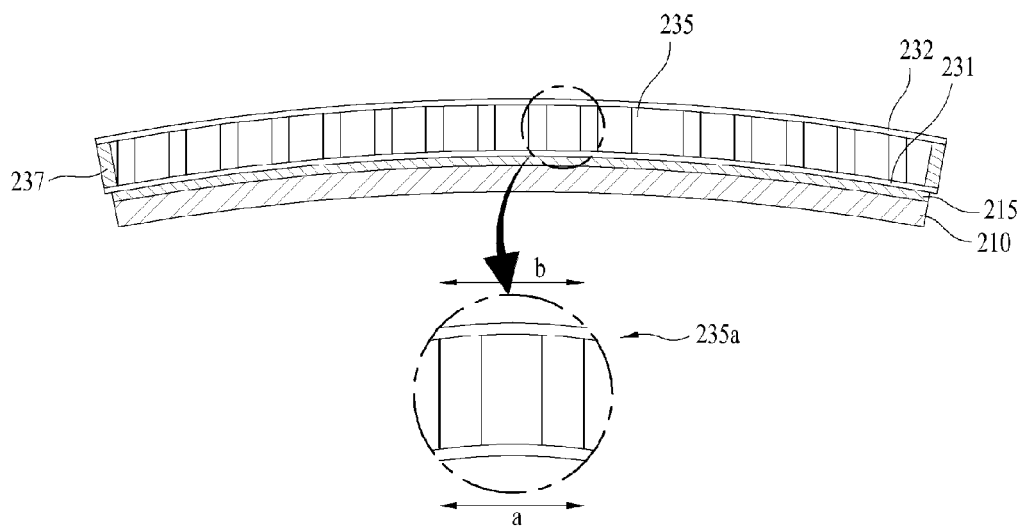
FIG. 15 is a sectional view showing the display device according to the fourth embodiment of the present invention.

FIG. 15 is a sectional view showing the display device 200 according to the fourth embodiment of the present invention. In the display device 200 using the curved display panel 210, it is necessary for a sandwich honeycomb panel 230 attached to the rear of the display panel 210 to also be curved so as to correspond to the curve of the display panel 210.

In a case in which a flat sandwich honeycomb panel 230 is curved so as to correspond to the curve of the display panel 210, the sandwich honeycomb panel 230 has restoring force to the original shape in the same manner as in the display panel 210. Therefore, the sandwich honeycomb panel 230 is capable of offsetting restoring force of the display panel 210 to the flat shape. That is, the a honeycomb structure 235 is configured using flat members which are not curved.

Figure 16A:
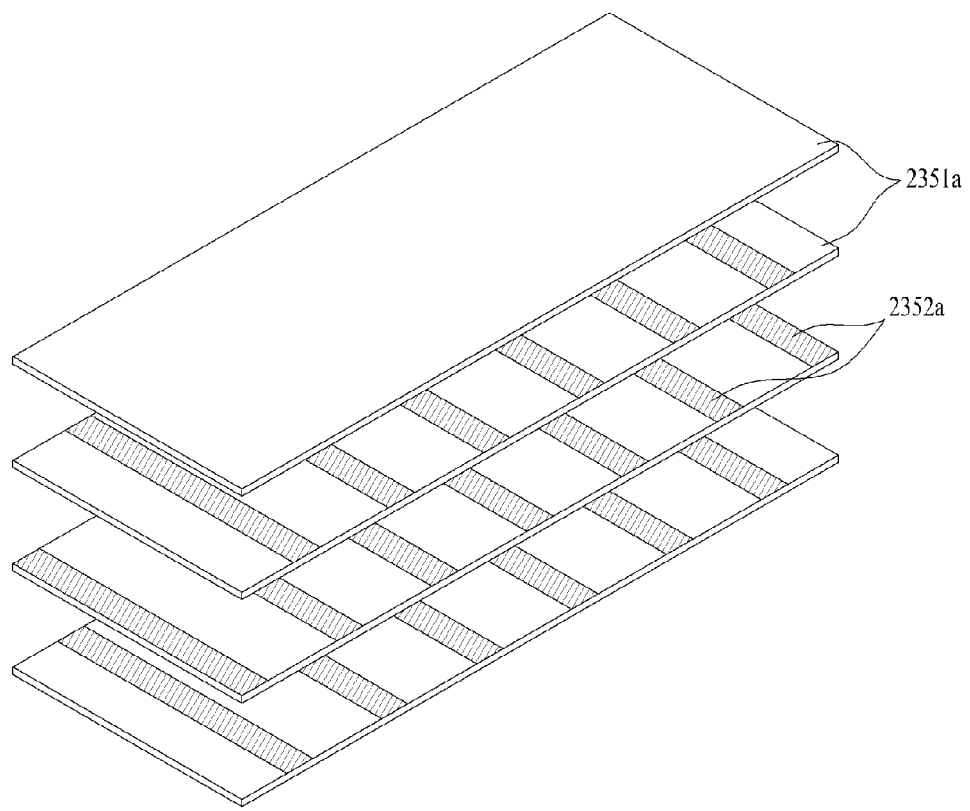
FIGS. 16A to 16C are a flow process showing a method of manufacturing a honeycomb structure of the display device according to an embodiment of the present invention.
Figure 16B:
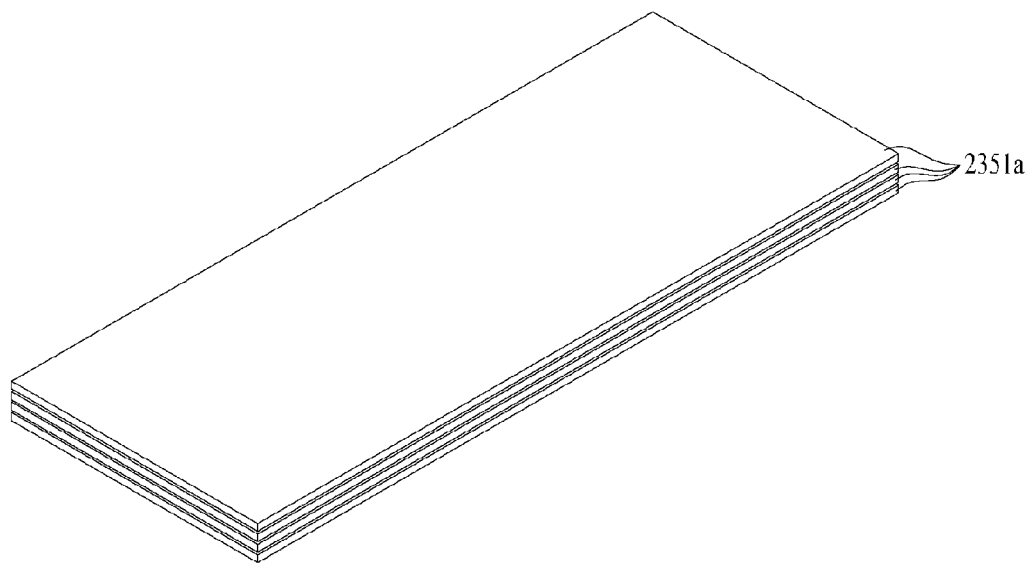
Figure 16C:
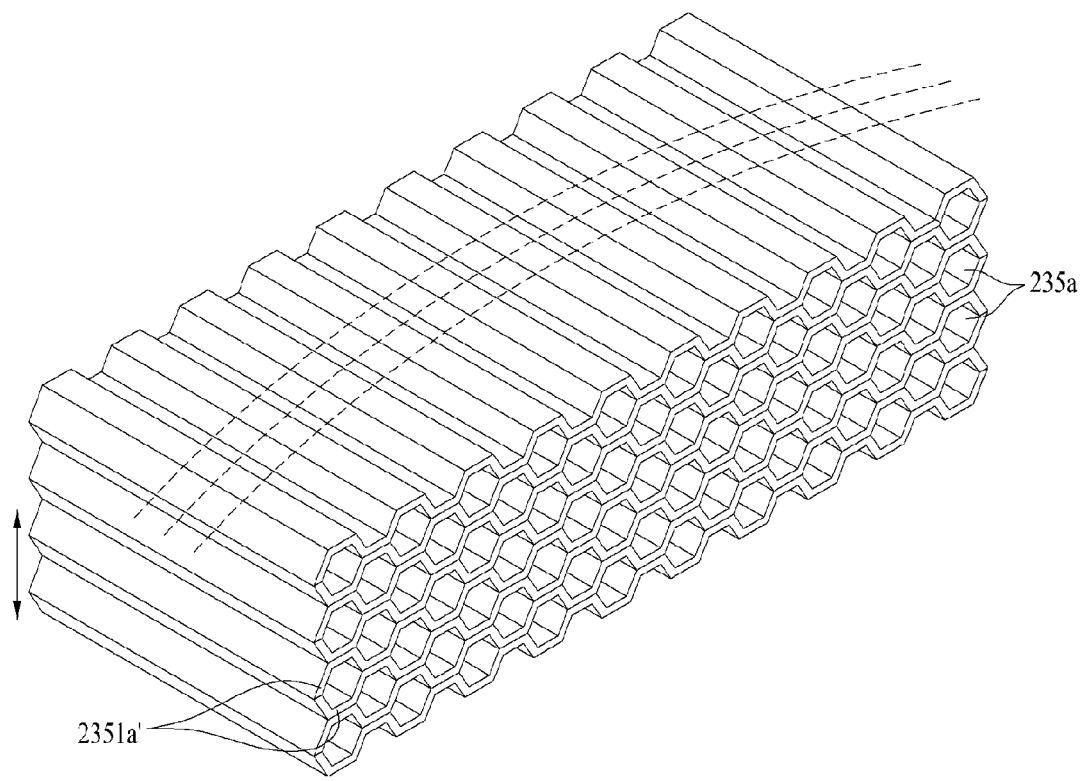

Referring to FIG. 15, the honeycomb structure 235 is configured such that facing sides of hexagonal unit cells 235*a* are parallel to each other and the front hexagon and the rear hexagon of each hexagonal unit cell 235*a* have the same size (a=b). FIGS. 16A to 16C are a flow process showing a method of manufacturing the honeycomb structure 235 of FIG. 15.

As shown in FIG. 16A, bonding agents 2352*a* are applied to a plurality of flat plates 2351*a* at predetermined intervals. The intervals between the applied bonding agents 2352*a* may be three times the width of each of the applied bonding agents 2352*a*. At this time, the bonding agents 2352*a* are disposed such that positions of the bonding agents 2352*a* applied to neighboring flat plates are not aligned with each other. After the flat plates 2351*a*, to which the bonding agents 2352*a* are applied, are stacked as shown in FIG. 16B, the flat plates 2351*a* are pulled upward and downward. As a result, portions of the upper and lower flat plates 2351*a* to which the bonding agents 2352*a* are applied are not separated from each other but portions of the upper and lower flat plates 2351*a* to which the bonding agents 2352*a* are not applied are separated from each other. Consequently, a honeycomb structure 235*a* having hexagonal unit cells 235*a* is formed as shown in FIG. 16C.

In addition to the above method, plate type members 2351*a* bent in a trapezoidal shape may be stacked to form the honeycomb structure 235. Each of the flat plates 2351*a* has a large width. Since the thickness of the honeycomb structure is large as shown in FIG. 16C, the flat plates 2351*a* may be cut so as to have a shape corresponding to the curvature of the display panel 210. As a result, it is possible to obtain a honeycomb structure 235 used in the display device 200 of the present embodiment.

Figure 17:
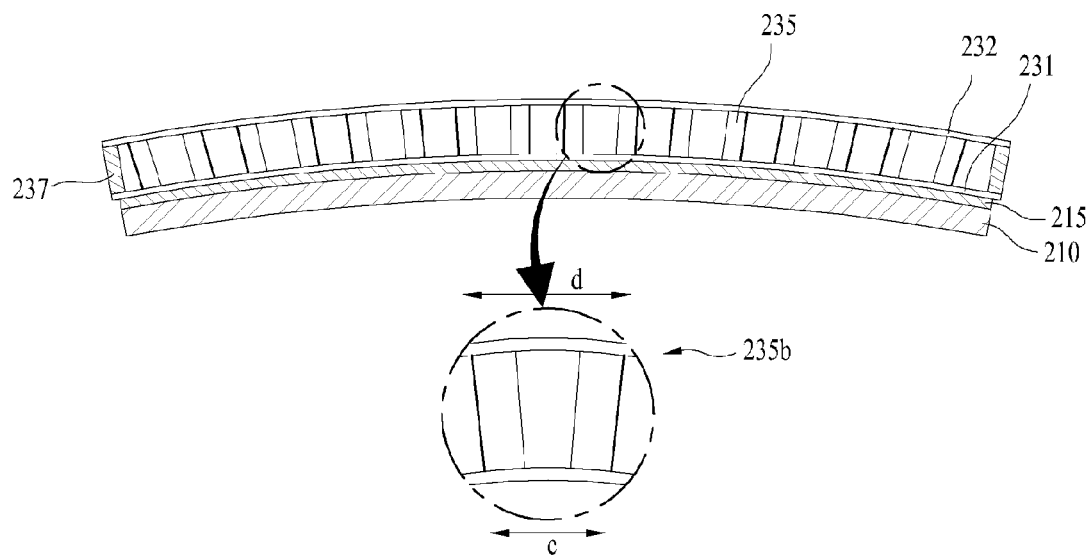
FIG. 17 is a sectional view showing a display device according to a fifth embodiment of the present invention.

FIG. 17 is a sectional view showing a display device 200 according to a fifth embodiment of the present invention. In this embodiment, sidewalls of unit cells 235*b* are not parallel to each other unlike the previous embodiment. Specifically, the sidewalls of the unit cells 235*b* are tilted so as to correspond to the curvature of a display panel 210. As a result, the size of a hexagon contacting a front thin plate 231 is different from that of a hexagon contacting a rear thin plate 232 (c<d).

Figure 18:
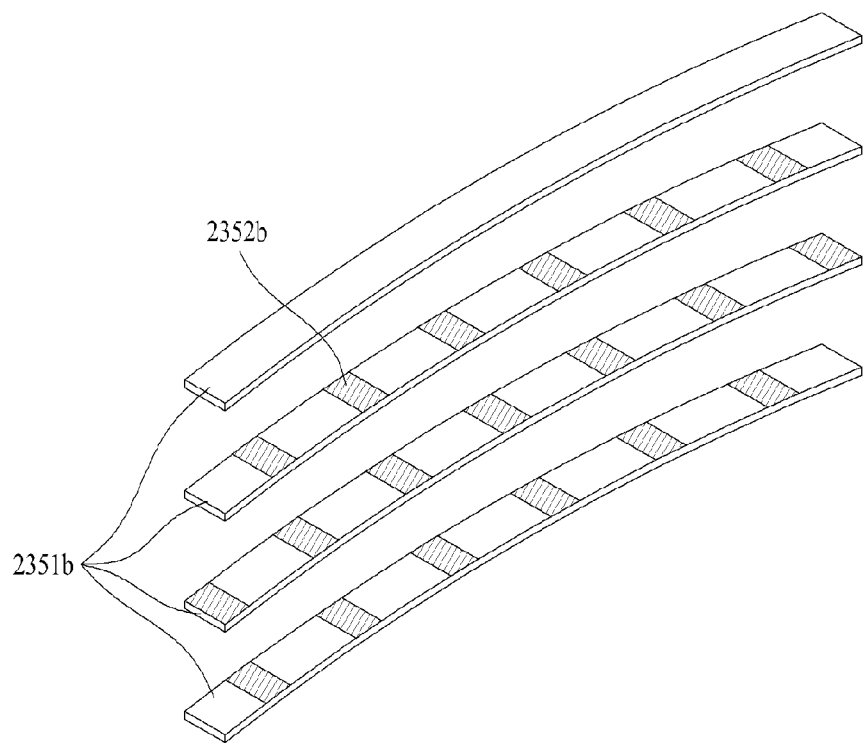
FIG. 18 is a sectional view showing an arch-shaped plate type member used to manufacture a honeycomb structure of the display device according to the fifth embodiment of the present invention.

A honeycomb structure 235 of this embodiment may be formed using arch-shaped plate type members 2351*b* corresponding to the curvature of the display panel 210 as shown in FIG. 18. Bonding agents 2352*b* are not applied in parallel but are applied in a tilted fashion so as to correspond to the curvature of the display panel 210. The plate type members 2351*b* are stacked such that positions of the bonding agents 2352*b* applied to neighboring plate type members 2351*b* are not aligned with each other and are then pulled upward and downward. As a result, a honeycomb structure 235 having unit cells 235*b*, the sidewalls of which are tilted, may be formed as shown in FIG. 17.

Alternatively, unit cells 235*b* configured such that sidewalls of the unit cells are tilted and the size of front hexagons is different from that of rear hexagons are manufactured and then the unit cells 235*b* are arranged in a honeycomb pattern to manufacture a curved honeycomb structure 235 as shown in FIG. 17.

In a case in which a flat honeycomb structure is bent to manufacture a curved honeycomb structure, restoring force of the curved honeycomb structure to the flat shape is great and, during bending of the flat honeycomb structure, the honeycomb structure may be broken. In a case in which the honeycomb structure 235 is manufactured using the above method, however, the honeycomb structure has no restoring force to the flat shape. Consequently, it is possible to maintain the curved state of the display panel 210.

Since the restoring force at the middle portion of the curved display panel 210 is greater than that at the other portions of the curved display panel 210, the sandwich honeycomb panel 230 may be configured such that the middle portion of the sandwich honeycomb panel 230 has greater rigidity than the other portions of the sandwich honeycomb panel 230 to offset the restoring force.

Figure 19:
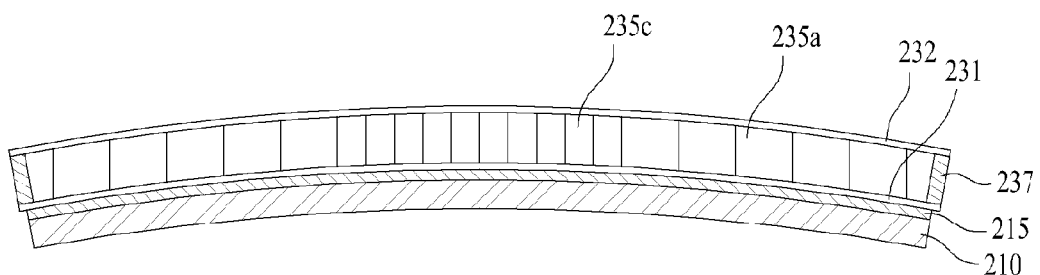
FIG. 19 is a sectional view showing a display device according to a sixth embodiment of the present invention.

As shown in FIG. 19, the sandwich honeycomb panel 230 may be configured such that small-sized unit cells 235*c* of the honeycomb structure 235 are disposed at the middle portion of the sandwich honeycomb panel 230 to offset restoring force applied to the middle portion of the sandwich honeycomb panel 230.

Figure 20:
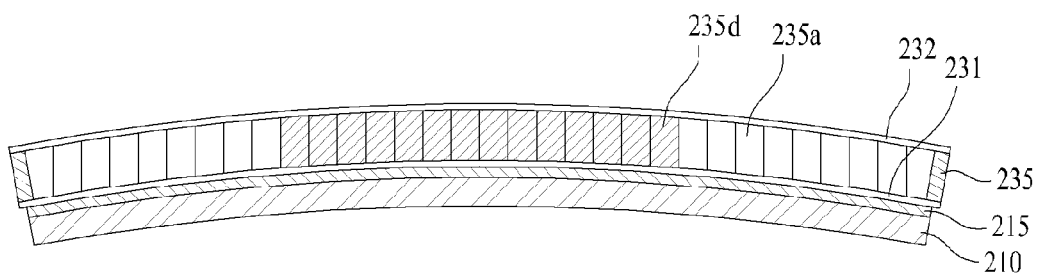
FIG. 20 is a sectional view showing a display device according to a seventh embodiment of the present invention.

Alternatively, as shown in FIG. 20, the unit cells 235*d* located at the middle portion of the sandwich honeycomb panel 230 may be formed of a material exhibiting higher rigidity than that for the unit cells 235*a* located at the other portions of the sandwich honeycomb panel 230 or the unit cells 235*d* located at the middle portion of the sandwich honeycomb panel 230 may have a greater thickness of the sidewalls than the unit cells 235*a* located at the other portions of the sandwich honeycomb panel 230 to offset the restoring force.

A termination member 237 is attached to the circumference of the sandwich honeycomb panel 230 such that the termination member 237 covers the circumference of the sandwich honeycomb panel 230 and, therefore, the honeycomb structure 235 is not exposed outward.

In the same manner as has been previously described with reference to FIGS. 12 and 13, one of the thin plates 231 and 232 disposed at opposite sides of the sandwich honeycomb panel 230 may be formed so as to be larger than the honeycomb structure 235 such that one of the thin plates 231 and 232 protrudes outward from the honeycomb structure 235 to cover the honeycomb structure 235 exposed from the circumference of the sandwich honeycomb panel 230.

Figure 21:
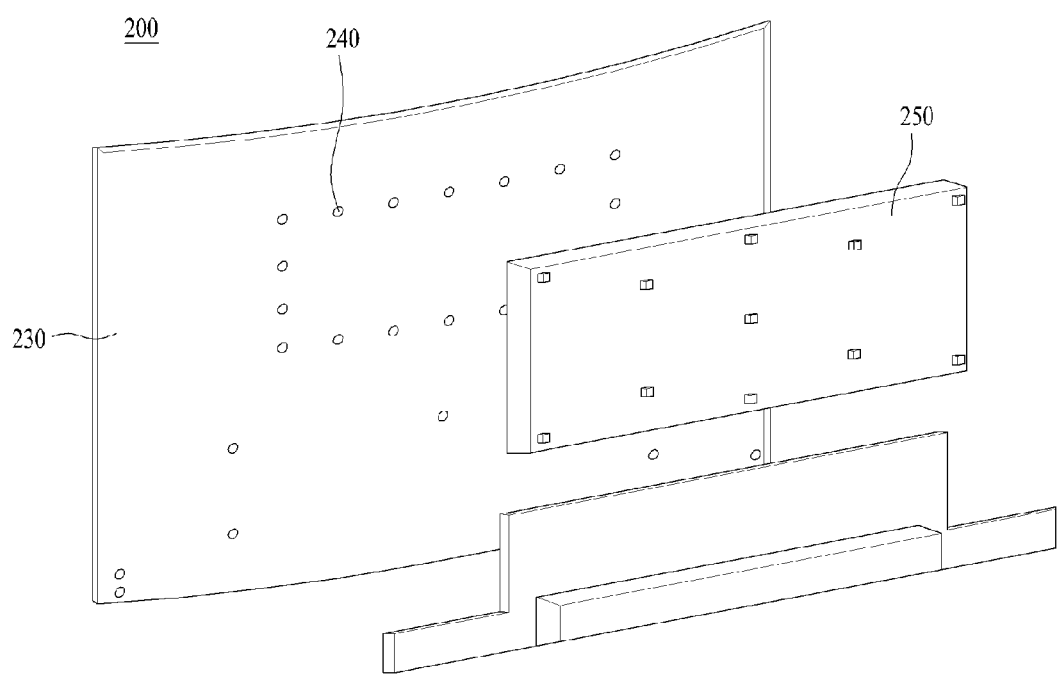
FIG. 21 is an exploded perspective view showing the rear of the display device of FIG. 14.

As shown in FIG. 21, a control box 250, which is coupled to the rear of the display device 200, is fixed to the sandwich honeycomb panel 230. At this time, it may be necessary to insert a plurality of PEM nuts 240 into the sandwich honeycomb panel 230. Even in a case in which the display device 200 is curved, PEM nuts 240 corresponding to the shape of hexagonal pillar shaped unit cells 235a may be inserted and fixed in corresponding ones of the unit cells 235a or a portion of the honeycomb structure 235 may be cut, the PEM nuts 240 may be inserted into the cut portion of the honeycomb structure 235, and the cut portion of the honeycomb structure 235 may be filled with a resin 36 to fix the PEM nuts 240 in the sandwich honeycomb panel 230 in the same manner as in the PEM nuts 140 of the flat type display device 100. A detailed description thereof will be omitted.

In a display device according to at least one embodiment of the present invention, a sandwich honeycomb panel disposed at the rear of a curved display panel offsets restoring force of the curved display panel to a flat shape. Consequently, it is possible to support the curved display panel while maintaining a curved state of the curved display panel.

In addition, the rigidity of the sandwich honeycomb panel is great as compared with the weight and thickness of the sandwich honeycomb panel. Consequently, it is possible to reduce the size and weight of the display device.

In addition, PEM nuts suitable for a specific structure of the sandwich honeycomb panel are used to stably fix the PEM nuts to the sandwich honeycomb panel. Furthermore, a coupling structure between the PEM nuts and the sandwich honeycomb panel is simple. Consequently, it is possible to simplify a process of coupling the PEM nuts to the sandwich honeycomb panel.

Those skilled in the art will appreciate that the present invention may be embodied in other specific forms than those set forth herein without departing from the spirit and essential characteristics of the present invention.

The above description is therefore to be construed in all aspects as illustrative and not restrictive. The scope of the invention should be determined by reasonable interpretation of the appended claims and all changes coming within the equivalency range of the invention are intended to be embraced in the scope of the claims.

What is claimed is:

1. A display device comprising:
   a display module;
   a sandwich honeycomb panel coupled to a rear of the display module, the sandwich honeycomb panel comprising a front thin plate located at the rear of the display module, a rear thin plate opposing the front thin plate, and a honeycomb structure disposed between the front thin plate and the rear thin plate, the honeycomb structure comprising a plurality of hexagonal unit cells; and
   a fastener comprising a fastener body having a screw insertion part formed at one end thereof, the fastener body being inserted into the sandwich honeycomb panel such that the screw insertion part is exposed from a rear of the sandwich honeycomb panel,
   wherein the each hexagonal unit cell has a hollow hexagonal pillar shape and the fastener body has a hollow hexagonal pillar shape.

2. The display device according to claim 1, wherein the fastener body is fastened to the front thin plate by a screw.

3. The display device according to claim 1, wherein the fastener further comprises a fastener head formed at the other end of the fastener body, the fastener head having a greater size than a diameter of the fastener body, and a portion of the front thin plate into which the fastener is inserted is provided with an opening corresponding to a shape of the fastener head such that the fastener head is inserted into the opening.

4. The display device according to claim 3, wherein the fastener head is formed in a hexagonal shape.

5. The display device according to claim 3, wherein the fastener head has a same thickness as the front thin plate.

6. The display device according to claim 3, wherein the fastener head is coupled to the fastener body by a screw.

7. The display device according to claim 1, wherein
   the fastener body protrudes from the rear thin plate, and
   the display device further comprises a washer fitted on the protruding portion of the fastener body and fixed to the rear thin plate.

8. The display device according to claim 1, wherein a bonding agent is applied between the fastener and the sandwich honeycomb panel.

9. The display device according to claim 1, wherein
   the front thin plate or the rear thin plate comprises an end portion protruding outward from the honeycomb structure, and
   the end portion is bent to cover a circumference of the honeycomb structure.

10. The display device according to claim 1, wherein
    the front thin plate or the rear thin plate comprises an end portion protruding outward from the honeycomb structure, and
    a side termination member is attached to the end portion and a circumference of the honeycomb structure.

11. The display device according to claim 1, wherein the sandwich honeycomb panel contains aluminum.

12. The display device according to claim 1, wherein the front thin plate and the rear thin plate have a thickness of 0.6 mm or less.

13. The display device according to claim 1, wherein the display module comprises an organic light emitting diode (OLED).

14. A display device comprising:
    a curved display module, a middle portion of which protrudes in a rear direction with respect to right and left portions and the right and left portions which protrude in a front direction with respect to the middle portion; and
    a sandwich honeycomb panel coupled to a rear of the display module, the sandwich honeycomb panel being curved, wherein the sandwich honeycomb panel comprises:
    a front thin plate located at the rear of the display module;
    a rear thin plate opposing the front thin plate; and
    a honeycomb structure disposed between the front thin plate and the rear thin plate, the honeycomb structure comprising a plurality of hexagonal unit cells,
    wherein the honeycomb structure is configured such that sizes of hexagonal unit cells located at a middle portion of the display module are less than those of hexagonal unit cells located at left and right portions of the display module.

15. The display device according to claim 14, wherein each of the hexagonal unit cells comprises six side walls configured such that each facing side wall of each of the hexagonal unit cells are parallel to each other.

16. The display device according to claim 15, wherein the honeycomb structure is formed by stacking a plurality of metal sheets having concave and convex parts formed in a trapezoidal fashion such that the metal sheets are not aligned with each other.

17. The display device according to claim 14, wherein each of the hexagonal unit cells is configured such that a size of a hexagon contacting the rear thin plate is greater than that of a hexagon contacting the front thin plate.

18. The display device according to claim 14, wherein the honeycomb structure comprises first hexagonal unit cells disposed at a middle portion of the display module and second hexagonal unit cells disposed at left and right portions of the display module, and
   the first hexagonal unit cells have greater rigidity than the second hexagonal unit cells.

19. The display device according to claim 14, wherein a termination member is attached to a circumference of the sandwich honeycomb panel.

20. The display device according to claim 14, further comprising:
   a PEM nut comprising a PEM nut body having a screw insertion part formed at one end thereof, the PEM nut being inserted into the sandwich honeycomb panel such that the screw insertion part is directed in a rear direction, wherein
   the rear thin plate further comprises an opening, through which the screw insertion part is exposed.

* * * * *